(12) United States Patent
Kato

(10) Patent No.: US 12,211,127 B2
(45) Date of Patent: Jan. 28, 2025

(54) DEVICE, METHOD, AND COMPUTER-READABLE MEDIUM FOR MANAGING DRAWING DATA INCLUDING RASTER DATA

(71) Applicant: CADDi, Inc., Tokyo (JP)

(72) Inventor: Yushiro Kato, Tokyo (JP)

(73) Assignee: CADDi, Inc., Tokyo (JP)

( * ) Notice: Subject to any disclaimer, the term of this patent is extended or adjusted under 35 U.S.C. 154(b) by 0 days.

(21) Appl. No.: 18/765,050

(22) Filed: Jul. 5, 2024

(65) Prior Publication Data

US 2024/0362838 A1  Oct. 31, 2024

Related U.S. Application Data

(63) Continuation of application No. PCT/JP2023/008559, filed on Mar. 7, 2023.

(30) Foreign Application Priority Data

Mar. 8, 2022  (JP) ................................. 2022-035742

(51) Int. Cl.
*G06T 11/20* (2006.01)
*G06V 30/14* (2022.01)
*G06V 30/18* (2022.01)

(52) U.S. Cl.
CPC ........ *G06T 11/203* (2013.01); *G06V 30/1444* (2022.01); *G06V 30/18076* (2022.01)

(58) Field of Classification Search
CPC .............. G06T 11/203; G06V 30/1444; G06V 30/18076
See application file for complete search history.

(56) References Cited

U.S. PATENT DOCUMENTS 8,731,309 B1 * 5/2014 Deskevich ................ G06T 7/13
382/199

FOREIGN PATENT DOCUMENTS

| JP | 63-41986 A | 2/1988 |
|----|------------|--------|
| JP | H09-102037 A | 4/1997 |
| JP | H09-128429 A | 5/1997 |
| JP | 2001-117958 A | 4/2001 |

(Continued)

OTHER PUBLICATIONS

Written Opinion of the International Searching Authority for PCT Application No. PCT/JP2023/008559, dated Apr. 18, 2023. (Year: 2023).*

(Continued)

*Primary Examiner* — Jeffery A Brier
(74) *Attorney, Agent, or Firm* — Rimon P.C.

(57) ABSTRACT

A method for managing drawing data including raster data includes: vectorizing, by a computer, the drawing data to generate vector data; generating, by the computer, dimension line data associated with first and second nodes included in the vector data; performing, by the computer, character recognition on a corresponding region in the drawing data corresponding to a close region close to a dimension line represented by the dimension line data; storing, by the computer, a character obtained by the character recognition as a dimension value in association with the dimension line data; and calculating, by the computer, a number of pixels per 1 mm on a drawing represented by the drawing data using the dimension value.

9 Claims, 9 Drawing Sheets

(56) References Cited

FOREIGN PATENT DOCUMENTS

| JP | 2008-134718 A | | 6/2008 |
|----|---------------|---|--------|
| JP | 2009-276869 A | | 11/2009 |
| JP | 2021026360 A | * | 2/2021 |

OTHER PUBLICATIONS

International Preliminary Report on Patentability for PCT Application No. PCT/JP2023/008559, dated Sep. 10, 2024. (Year: 2024).*
International Search Report received in PCT Application No. PCT/JP2023/008559, dated Apr. 18, 2023.
Decision to Grant a Patent received in Japanese Patent Application No. 2022-035742, dated May 24, 2024.

* cited by examiner

FIG.4

```
"Dimension": {
    "projection_lines": [
      {
        "line": {
          "p1": [2166.5538971807623, 3117.999999999999],
          "p2": [2434.0, 3118.0]
        }
      },
      {
        "line": {
          "p1": [2434.0, 3602.11222655885],
          "p2": [2166.5538971807623, 3602.112226558849]
        }
      }
    ],
    "dimension_chains": [
      {
        "axis": {
          "p1": [2403.201750382096, 3117.999993562535],
          "p2": [2403.1978471757993, 3601.999993531058]
        },
        "arrow_heads": [
          {
            "pos": 1.3300547294337243e-8,
            "reversed": false
          },
          {
            "pos": 1.0002318864210733,
            "reversed": true
          }
        ]
      }
    ]
}
```

FIG.6

```
"dimension_chains": [
  {
    "axis": {
      "p1": [2403.201750382096, 3117.999993562535],
      "p2": [2403.1978471757993, 3601.999993531058]
    },
    "arrow_heads": [
      {
        "pos": 1.3300547294337243e-8,
        "reversed": false
      },
      {
        "pos": 1.0002318864210733,
        "reversed": true
      }
    ],
    "dimensions": [
      {
        "value": 24.0,
        "text": {
          "value": [
            " ⌀ 24",
            [
              [2379.05538908335, 3274.8023166300627],
              [2379.054024056089, 3444.066543038759],
              [2309.1764742406713, 3444.0659795129477],
              [2309.1778392679325, 3274.8017531042524]
            ]
          ]
        }
      }
    ]
  }
],
"pixel_per_millimeter": 20.17134277394135
```

FIG.9

```
"Symbol": {
    "Arrow": [
        "pattern": {
            "axis_length": 60.0,
            "head_length": 30.0,
            "head_degree": 15.0
        },
        "position": {
            "head": [
                2401.7845414181793,
                3602.487066010055
            ],
            "dir": [
                -0.03342578569189192,
                0.999441202298004
            ]
        }
    }
}
```

DEVICE, METHOD, AND COMPUTER-READABLE MEDIUM FOR MANAGING DRAWING DATA INCLUDING RASTER DATA

CROSS-REFERENCE TO RELATED APPLICATIONS

This application is a continuation of PCT International Application No. PCT/JP2023/008559 filed on Mar. 7, 2023 which claims the benefit of priority from Japanese Patent Application No. 2022-035742 filed on Mar. 8, 2022, the entire contents of which are incorporated herein by reference.

FIELD

The present invention relates to a device, a method, and a computer-readable medium for managing drawing data including raster data.

BACKGROUND

As one automobile includes about 30000 components, various components are required in manufacturing industry. Typically, manufacturers do not process all of such various kinds of components by own company, but outsources manufacturing to outside processors.

In outsourcing manufacturing, a manufacturer provides a component drawing representing a component to be outsourced to a processor as an electronic medium or a paper medium printed from the electronic medium for an estimate, ordering, and the like, and the electronic medium is managed mainly as data in PDF format. After receiving the component drawing as a paper medium, the processor scans the component drawing to be managed mainly as data in PDF format.

Drawing data in PDF format includes layers or does not include layers. In the former case, part of lines, characters, and symbols in the drawing represented by the drawing data can be distinguished from each other by being represented by data in layers corresponding to respective types.

However, the drawing data in PDF format managed as described above may be obtained by scanning after the drawing data is printed and characters or symbols are added thereto by handwriting in many cases, so that the drawing data often does not include layers. Thus, information about the types of lines, characters, and symbols in the drawing is not held in many cases.

In manufacturing industry, drawing data representing a component includes data related to a component name, a figure number, a serial number, a material, surface treatment, and the like in addition to a shape and dimensions. For example, if what a certain number represents can be recognized, various advantages can be expected in software for managing drawing data such that retrievability is improved, extraction of a similar drawing is facilitated, and the like. It is particularly advantageous if values of dimensions can be distinguished from other numerical values.

In the above description, image data in PDF format is exemplified, but the present invention can be widely applied to drawing data representing a component including raster data, and is further preferable to data not including layers. Examples of data formats include JPG format, TIFF format, and the like. The "raster data" is data including a plurality of pixels. Image data in JPG format or TIFF format typically includes only raster data, but image data in PDF format may include vector data or text data in addition to the raster data in some cases.

The present invention has been made in view of such a situation, and has an object to enable recognition of values of dimensions in a drawing represented by drawing data including raster data in managing the drawing data.

SUMMARY

In order to achieve such an object, a method according to an aspect of the present invention is for managing drawing data including raster data, and includes: vectorizing, by a computer, the drawing data to generate vector data; generating, by the computer dimension line data associated with first and second nodes included in the vector data; performing, by the computer, character recognition on a corresponding region in the drawing data corresponding to a close region close to a dimension line represented by the dimension line data; storing, by the computer, a character obtained by the character recognition as a dimension value in association with the dimension line data; and calculating, by the computer, a number of pixels per 1 mm on a drawing represented by the drawing data using the dimension value.

BRIEF DESCRIPTION OF THE DRAWINGS

FIG. 4 is a diagram illustrating an example of dimension line data according to an embodiment of the present invention;

FIG. 6 is a diagram illustrating an example in which a value of a dimension is added to the dimension line data according to the embodiment of the present invention;

FIG. 9 is a diagram illustrating an example of data describing an arrow included in the drawing of FIG. 3.

DETAILED DESCRIPTION

The following describes embodiments of the present invention in detail with reference to the drawings.

First Embodiment

Figure 1:
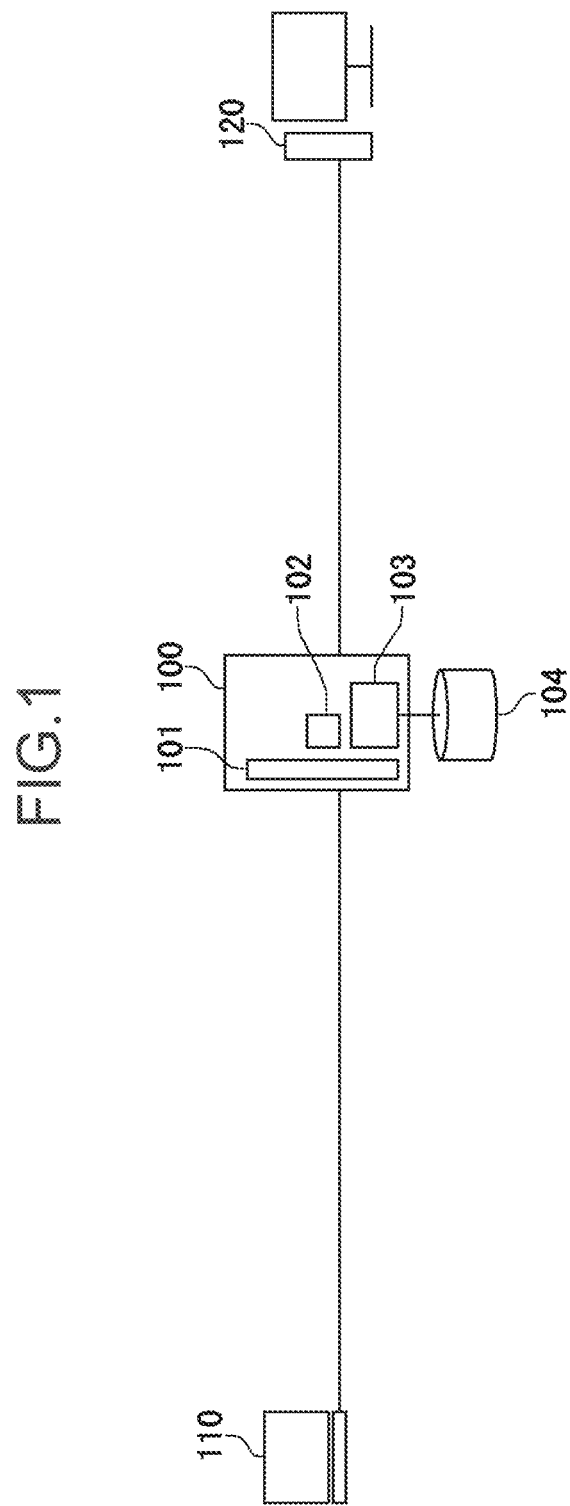
FIG. 1 is a diagram illustrating a device for managing drawing data according to a first embodiment of the present invention.

FIG. 1 illustrates a device for managing drawing data according to a first embodiment of the present invention. A device 100 communicates with a manufacturer terminal 110 used by a manufacturer via an IP network such as the Internet, and enables drawing data to be managed. The device 100 can similarly communicate with a processor terminal 120 used by a processor, and can also provide a drawing management service for the processor. A user of the drawing management service is not particularly limited, but the present embodiment describes an example in which the manufacturer uses the drawing management service.

The device 100 includes a communication unit 101 such as a communication interface, a processing unit 102 of at least one processor such as a CPU, and a storage unit 103 including a storage medium or a storage device such as a memory and a hard disk, and can be configured by executing computer programs for performing respective pieces of processing. The device 100 may include one or more devices, computers, or servers. The computer program may include one or more computer programs, and can be recorded in a computer-readable storage medium to be a non-transitory computer program product. The computer program can be stored in a storage medium or a storage device such as a database 104 that can be accessed via an IP network from the storage unit 103 or the device 100, and executed by the processing unit 102. Data described below as being stored in the storage unit 103 may be stored in the database 104, and vice versa.

Figure 3:
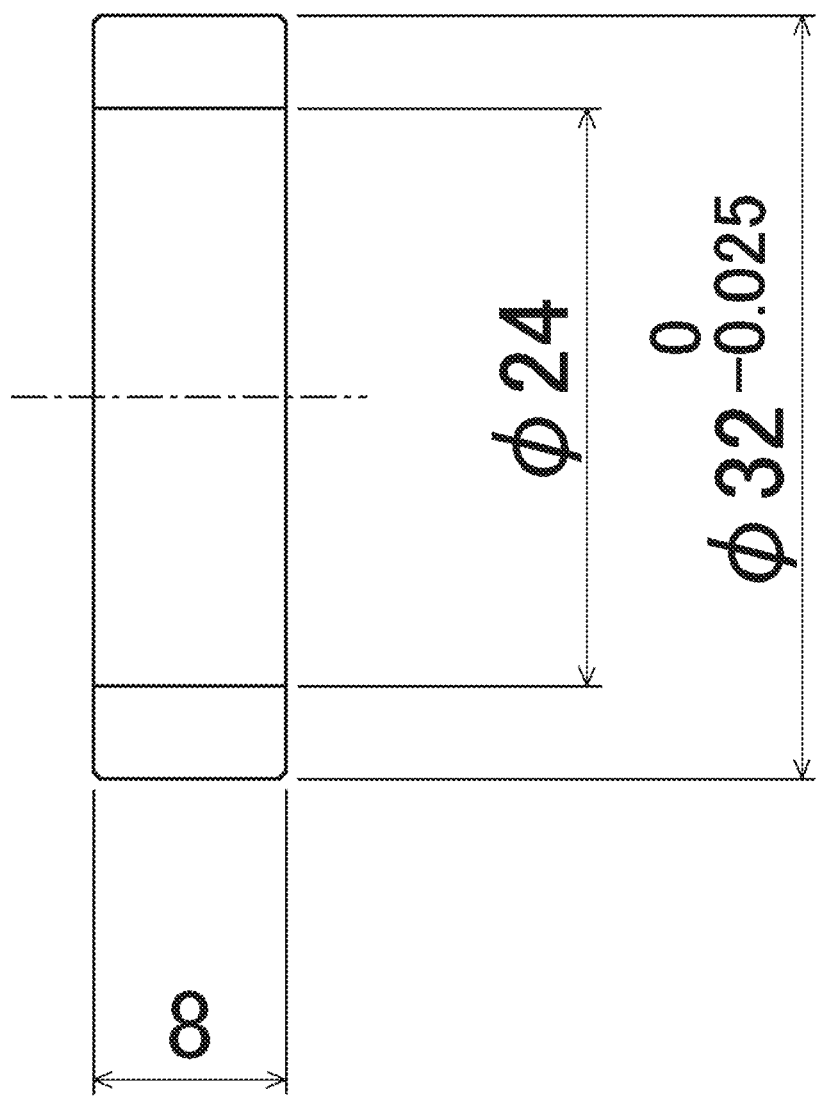
FIG. 3 is a diagram illustrating a partial enlarged view of an example of a drawing displayed by drawing data according to the first embodiment of the present invention.

First, the device 100 acquires drawing data in a raster format (S201). For example, the drawing data is stored in the storage unit 103 by being uploaded and registered to a Web page provided by the device 100 by a purchasing agent of the manufacturer, and is read out to be acquired. FIG. 3 is a partial enlarged view of an example of a drawing displayed by the drawing data.

Next, the device 100 vectorizes the drawing data and converts the data into vector data (S202). Herein, "vectorization" means to convert data into data representing a plurality of points (hereinafter, also referred to as "nodes") and one or more line segments (hereinafter, also referred to as "edges") connecting at least two of the points. The obtained vector data may be treated as a file separated from the drawing data, or treated as data in a layer different from the drawing data by adding the layer to a file including the drawing data.

In the vector data, each edge can be represented as follows by way of example.

(
(x1, y1),
(x2, y2)
)

Herein, assuming that the lower left of the drawing represented by the drawing data is an origin, a lateral direction is the X-axis, and a vertical direction is the Y-axis, each node of an edge is represented in a format of (x, y). The line segment depicted in FIG. 3 is not necessarily a single edge as vector data, and may be converted into a plurality of edges in some cases.

Thinning may be performed on the drawing data before vectorization. By way of example, by causing each pixel of the raster data included in the drawing data to be binarized or multivalued as needed, and reducing a width of a continuous region taking the same value, accuracy of nodes and edges can be increased.

Next, the device 100 generates dimension line data associated with first and second nodes included in the vector data (S203). FIG. 4 illustrates an example of the dimension line data according to an embodiment of the present invention. The dimension line data is data in JSON format representing a dimension line of a diameter of 24 mm illustrated in FIG. 3. "Dimension" represents that the data is dimension line data, and information related to the dimension line is described as values of a key "dimension chains". As values of a key "projection lines", two dimensional auxiliary lines associated with the dimension line are described. The values of the key "dimension chains" include coordinates of a first node "p1" as one tip end apex of the detected dimension line, and coordinates of a second node "p2" as the other tip end apex thereof. A key "arrow heads" represents orientations of first and second arrows included in the dimension line. Details about detection of the dimension line will be described later.

Subsequently, the device 100 identifies, from the vector data, one edge or a plurality of connected edges close to the dimension line represented by the dimension line data (S204). More specifically, it is preferable that one edge or a plurality of connected edges close to the dimension line do not include edges including an edge intersecting with an edge connecting the first and the second nodes included in the dimension line data, edges including an edge or a node that is too close (for example, within a range of 3 pixels) to an edge connecting the first and the second nodes included in the dimension line data, and the like.

The device 100 then performs character recognition on a corresponding region in the drawing data corresponding to a close region including the identified one edge or connected edges (S205), and stores a recognized character as a dimension in association with the dimension line data (S206). Recognition accuracy can be improved if a direction of the character is known when character recognition is performed, and thus an orientation of the corresponding region may be determined. By way of example, a direction of the edge connecting the first and the second nodes can be determined as an orientation of the close region or the corresponding region. As another example, a direction of a long side of the close region or the corresponding region may be determined as a direction of the close region or the corresponding region. Details about identification of one edge or a plurality of connected edges will be described later. Herein, "connected" means that edges include a common node.

There is a high possibility that connected edges close to the dimension line represent a dimension, and thus a value of the dimension included in the drawing data can be recognized in this way. Herein, one edge or a plurality of connected edges are identified, and a focus is put on the corresponding region in the drawing data corresponding to a region including the one edge or connected edges.

Alternatively, if a focus is put on the corresponding region in the drawing data corresponding to the close region close to the dimension line represented by the dimension line data, the possibility that a character in the corresponding region represents the value of the dimension is not low, and thus a value of the dimension included in the drawing data can be recognized.

The embodiment is not limited to the above. However, if a value of the dimension included in the drawing data can be stored, for example, the device 100 can enable the user of the drawing management service provided by the device 100 to designate at least one of a maximum dimension, a minimum dimension, and a dimension range included in the component to retrieve the drawing data.

Figure 5:
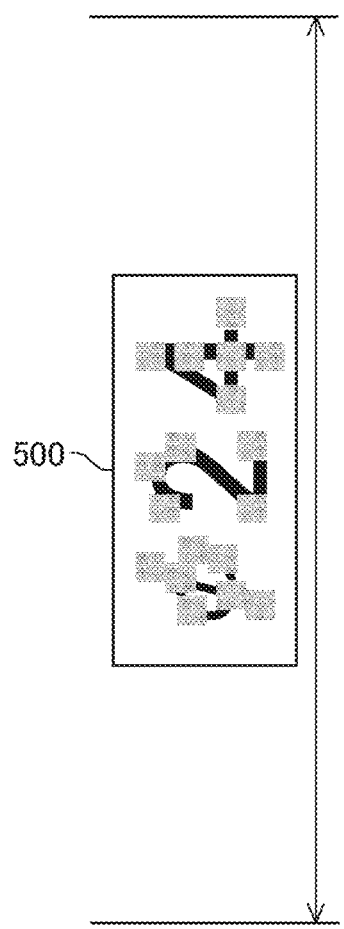
FIG. 5 is a drawing depicting, on the drawing of FIG. 3, a plurality of connected edges identified to be close to a dimension line illustrated in the drawing.

FIG. 5 depicts, on the drawing, a plurality of connected edges that are identified to be close to the detected dimension line, and a region 500 is identified as a region including the edges. In FIG. 6, coordinates of four apexes of the region including the identified one edge or connected edges, characters obtained by performing character recognition on the region, and a numerical value represented by the characters are added to values of the key "dimension chains" as a value of the key "dimensions". A key "pixel per millimeter" describes a result of calculating the number of pixels per 1 mm in the drawing data based on the number of pixels of the dimension line and a dimension value of the dimension line. For example, a value of the number of pixels corresponding to 1 mm may be calculated from a dimension value associated with the dimension line data for each of a plurality of pieces of generated dimension line data, and a median of a plurality of obtained calculation result columns may be caused to be a value of the key "pixel per millimeter". By using this value, a dimension of a desired point in the component can be calculated.

Details about Detection of Dimension Line

Figure 7:
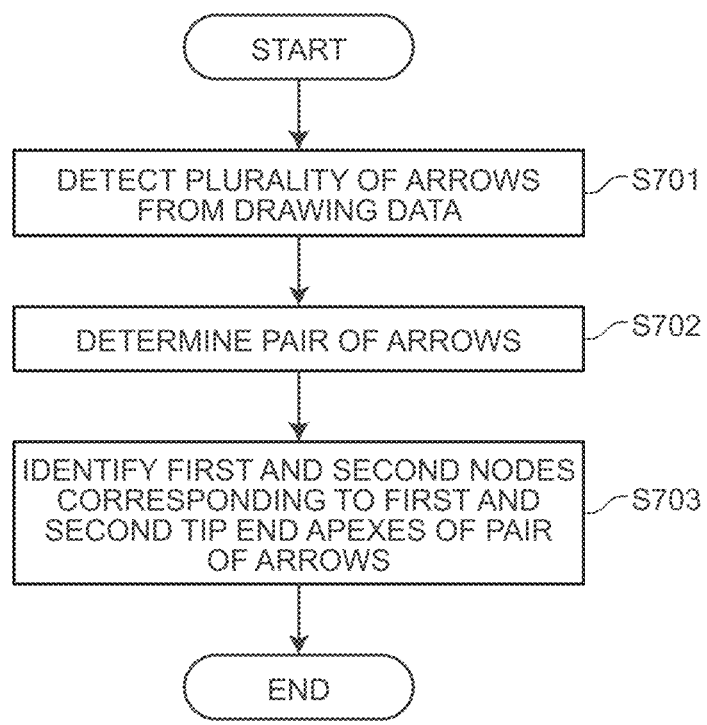
FIG. 7 is a diagram illustrating a procedure of a method for detecting a dimension line according to an embodiment of the present invention.
Figure 8:
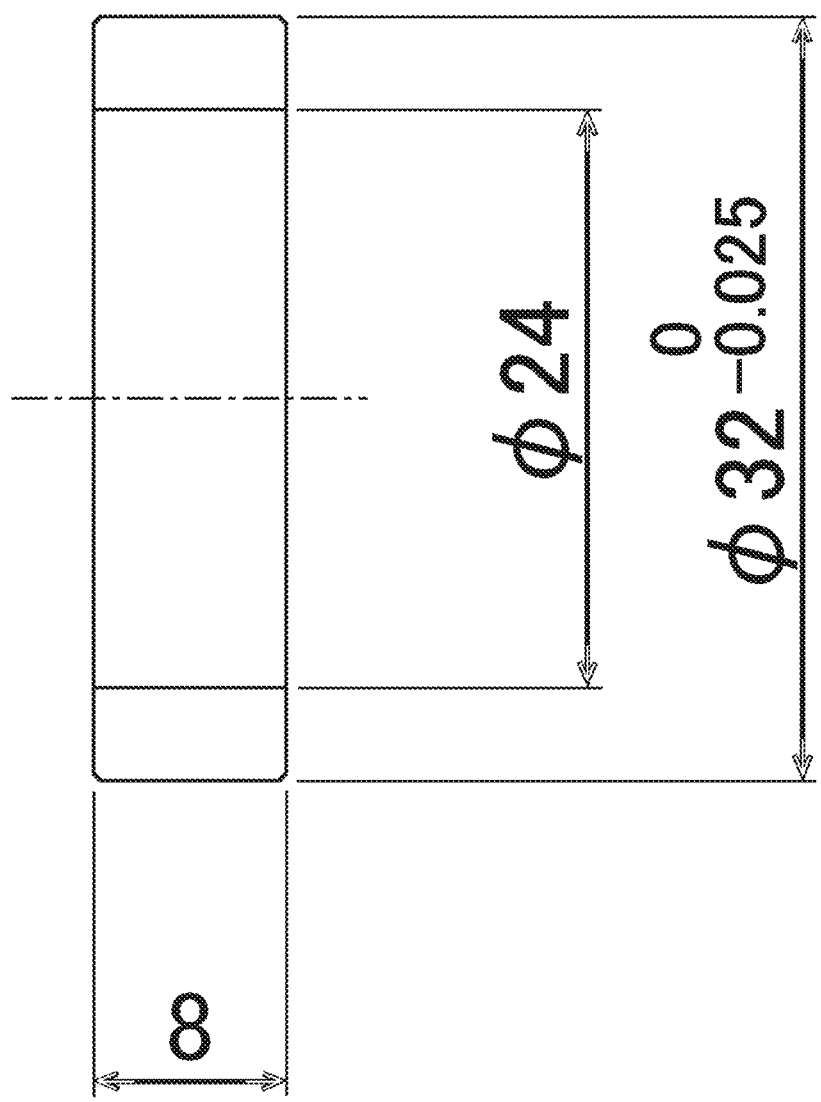
FIG. 8 is a diagram depicting, on the drawing of FIG. 3, a plurality of arrows included in the drawing in an emphasized manner.

FIG. 7 illustrates a procedure of a method for detecting a dimension line according to an embodiment of the present invention. First, the device 100 detects a plurality of arrows from the drawing data by performing pattern recognition by image processing (S701). FIG. 8 depicts the detected arrows on the drawing in an emphasized manner. FIG. 9 illustrates an example of data describing the detected arrow. The data is described in JSON format. A value of a key "head" represents apex coordinates of the arrow, and a value of a key "dir" represents an orientation of the arrow. The arrow corresponds to an upper arrow of the dimension line of the diameter of 24 mm.

The device 100 then determines at least a pair of arrows among the detected arrows (S702), and identifies the first and the second nodes in the vector data corresponding to the first and the second tip end apexes of the first and the second arrows included in the pair of arrows (S703). When the first and the second nodes corresponding to the tip end apexes are identified, the device 100 can generate dimension line data associated with the first and the second nodes.

By defining the same coordinate system as that of the vector data for the drawing data, the first and the second nodes corresponding to the coordinates of the first and the second tip end apexes can be identified. At this point, a node is not necessarily present at coordinates completely matching the coordinates of the first and the second tip end apexes of the determined pair of arrows, but by way of example, nodes close to or closest to the first and the second tip end apexes can be identified as the first and the second nodes, respectively. It is not necessary that the coordinate system defined for the vector data and the coordinate system defined for the drawing data are completely the same, but it is sufficient that coordinate points can be converted to each other.

The tip end apex of the dimension line may be represented by a symbol other than the arrow such as a black point. In this case, this substitute symbol is detected by image processing. Description of the key "arrow heads" illustrated in FIG. 4 is changed as appropriate corresponding to the substitute symbol. Description of an example of the arrow herein can be similarly applied to typical tip end apex symbols including the arrow.

Details about Identification of One Edge or Plurality of Connected Edges

Regarding the dimension line of the diameter of 24 mm focused on in the above description, when one edge or a plurality of connected edges positioned in a predetermined range in a direction perpendicular to an edge connecting the first and the second nodes are detected, there is a high possibility that the edge or the connected edges correspond to a dimension value.

In a case in which a line segment length between the nodes is short such as a dimension line of a length of 8 mm, the arrow may be oriented inward. In such a case, although the example of FIG. 8 is different, the dimension value is not depicted in a direction perpendicular to the edge connecting the nodes, but is depicted to be close to a line segment extended over one node of the edge in some cases. In this case, it is necessary to detect one edge or a plurality of connected edges positioned in a predetermined range in a direction perpendicular to the extended line segment.

From one or more edges close to the dimension line represented by the dimension line data, by excluding, as an edge not close to the dimension line, an edge having a distance equal to or larger than a predetermined value in the vertical direction from the edge connecting the nodes included in the dimension line data or the line segment extended over one node of the edge distant from a median of a plurality of estimation result columns of distance obtained for the edges, accuracy in identifying the close region and the corresponding region corresponding thereto can be improved.

In the embodiments described above, it is noted that, unless "only" is used such that "based on only xx", "in accordance with only xx", or "in a case of only xx", additional information may be considered herein. It is also noted that, by way of example, description of "perform b in a case of a" does not necessarily mean "always perform b in a case of a" or "perform b immediately after a" unless explicitly stated. Additionally, description of "each a constituting A" does not necessarily mean that A is constituted of a plurality of constituent elements, but encompasses a case in which a constituent element is single.

By way of precaution, if there is an aspect of performing an operation different from the operation described herein in any method, computer program, terminal, device, server, or system (hereinafter, "method and the like"), the aspects of the present invention are applied to the same operation as any of the operations described herein, and presence of the operation different from the operations described herein does not exclude the method and the like from the scope of the aspects of the present invention.

Figure 2:
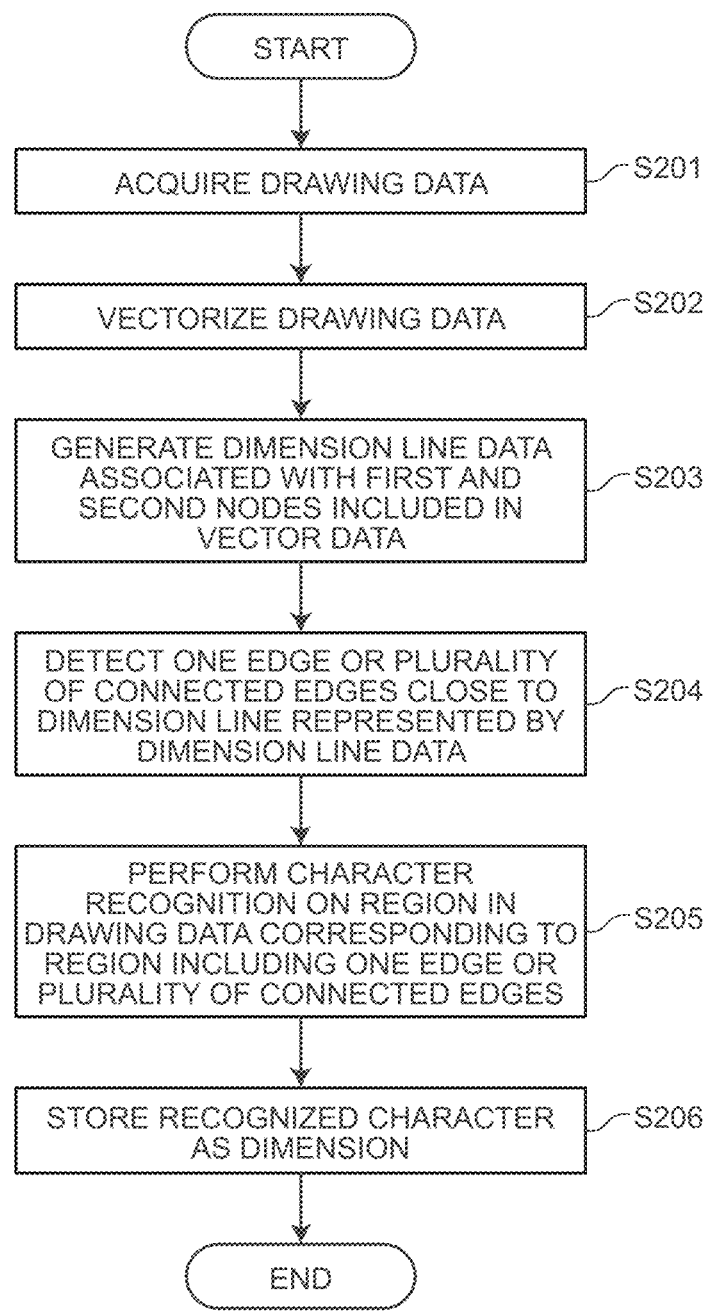
FIG. 2 is a diagram illustrating a procedure of a method for managing drawing data according to the first embodiment of the present invention.

In FIG. 2, "start" and "end" are merely examples, and do not mean that the processing in the method according to the present embodiment is necessarily started at S201 and necessarily ended at S206.

The embodiment described above exemplifies a case in which a computer on a server side or a client side is implemented by one computer. In contrast, software may be installed in a plurality of computers, and each of the computers may include all or part of the constituent elements according to the embodiment. In this case, a form of distributed computing may be employed such that the computers perform communication processing with each other. Information transmitted from the computer on the client side may be processed by one or more computers on the server side disposed on a cloud. The computer on the server side or the client side described in the embodiment includes each one of the constituent elements, but may include a plurality of the same constituent elements.

Various arithmetic operations executed by the computer in the present embodiment may be executed in parallel processing by using at least one processor or using a plurality of computers via a network. The various arithmetic operations may be distributed to a plurality of arithmetic cores in the processor to be executed in parallel processing. Alternatively, the various arithmetic operations executed by the computer on the server side may be executed by at least one processor and at least one storage device disposed on a cloud capable of communicating with the computer on the client side via a network.

Additional Notes In accordance with the description of the embodiments described above, the following technique is disclosed.

(1)

A method for managing drawing data including raster data, including:
vectorizing the drawing data to generate vector data;
generating dimension line data associated with first and second nodes included in the vector data;
performing character recognition on a corresponding region in the drawing data corresponding to a close region close to a dimension line represented by the dimension line data; and
storing a character obtained by the character recognition as a dimension value in association with the dimension line data.

(2)

The method according to (1), wherein
the generating the dimension line data includes:
detecting a plurality of tip end apex symbols from the drawing data;
determining at least a pair of tip end apex symbols among the plurality of detected tip end apex symbols; and
identifying first and second nodes in the vector data corresponding to first and second tip end apexes of the pair of tip end apex symbols.

(3)

The method according to (2), wherein the plurality of tip end apex symbols are arrows.

(4)

The method according to any one of (1) to (3), further including determining an orientation of the close region or the corresponding region (5)

The method according to any one of (1) to (4), wherein the close region is a region including one edge or a plurality of connected edges close to the dimension line represented by the dimension line data.

(6)

The method according to (5), wherein the close region is a region including one edge or a plurality of connected edges positioned in a predetermined range in a direction perpendicular to an edge connecting the first and the second nodes or a line segment extended over one node of the edge.

(7)

The method according to any one of (1) to (6), further including calculating a number of pixels per 1 mm on a drawing represented by the drawing data using the dimension value.

(8)

The method according to any one of (1) to (7), further including performing thinning processing on the drawing data before the vectorizing.

(9)

A program for cause a computer to perform a method for managing drawing data including raster data, the method including:
vectorizing the drawing data to generate vector data;
generating dimension line data associated with first and second nodes included in the vector data;
performing character recognition on a corresponding region in the drawing data corresponding to a close region close to a dimension line represented by the dimension line data; and
storing a character obtained by the character recognition as a dimension value in association with the dimension line data.

(10)

A program for cause a computer to perform the method according to any one of (1) to (8)

(11)

A recording medium (computer program product) storing the program according to (9) or (10) to be executed by the computer.

(12)

A device for managing drawing data including raster data, the device configured to:
vectorize the drawing data to generate vector data;
generate dimension line data associated with first and second nodes included in the vector data;
perform character recognition on a corresponding region in the drawing data corresponding to a close region close to a dimension line represented by the dimension line data; and
store a character obtained by the character recognition as a dimension value in association with the dimension line data.

(13)

A device for managing drawing data including raster data, including at least one processing circuitry configured to:
vectorize the drawing data to generate vector data;
generate dimension line data associated with first and second nodes included in the vector data;
perform character recognition on a corresponding region in the drawing data corresponding to a close region close to a dimension line represented by the dimension line data; and
store a character obtained by the character recognition as a dimension value in association with the dimension line data.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for managing drawing data including raster data, comprising:
vectorizing, by a computer, the drawing data to generate vector data;
generating, by the computer, dimension line data associated with first and second nodes included in the vector data;
performing, by the computer, character recognition on a corresponding region in the drawing data corresponding to a close region close to a dimension line represented by the dimension line data;
storing, by the computer, a character obtained by the character recognition as a dimension value in association with the dimension line data; and calculating, by the computer, a number of pixels per 1 mm on a drawing represented by the drawing data using the dimension value.

2. The method according to claim 1, wherein
the generating the dimension line data includes:
   detecting a plurality of tip end apex symbols from the drawing data;
   determining at least a pair of tip end apex symbols among the plurality of detected tip end apex symbols; and
   identifying first and second nodes in the vector data corresponding to first and second tip end apexes of the pair of tip end apex symbols.

3. The method according to claim 2, wherein the plurality of tip end apex symbols are arrows.

4. The method according to claim 1, further comprising determining an orientation of the close region or the corresponding region.

5. The method according to claim 1, wherein the close region is a region including one edge or a plurality of connected edges close to the dimension line represented by the dimension line data.

6. The method according to claim 5, wherein the close region is a region including one edge or a plurality of connected edges positioned in a predetermined range in a direction perpendicular to an edge connecting the first and the second nodes or a line segment extended over one node of the edge.

7. The method according to claim 1, further comprising performing thinning processing on the drawing data before the vectorizing.

8. A non-transitory computer-readable medium on which programmed instructions are stored, wherein the programmed instructions, when executed by a computer, causes the computer to perform a method for managing drawing data including raster data, the method comprising:
   vectorizing the drawing data to generate vector data;
   generating dimension line data associated with first and second nodes included in the vector data;
   performing character recognition on a corresponding region in the drawing data corresponding to a close region close to a dimension line represented by the dimension line data;
   storing a character obtained by the character recognition as a dimension value in association with the dimension line data; and
   calculating a number of pixels per 1 mm on a drawing represented by the drawing data using the dimension value.

9. A device for managing drawing data including raster data, the device configured to:
   vectorize the drawing data to generate vector data;
   generate dimension line data associated with first and second nodes included in the vector data;
   perform character recognition on a corresponding region in the drawing data corresponding to a close region close to a dimension line represented by the dimension line data;
   store a character obtained by the character recognition as a dimension value in association with the dimension line data; and
   calculate a number of pixels per 1 mm on a drawing represented by the drawing data using the dimension value.

\* \* \* \* \*